(12) United States Patent
Moriyama

(10) Patent No.: US 6,704,091 B2
(45) Date of Patent: Mar. 9, 2004

(54) EXPOSURE APPARATUS AND EXPOSURE METHOD

(75) Inventor: Norio Moriyama, Tokyo (JP)

(73) Assignee: Oki Electric Industry, Ltd., Tokyo (JP)

(*) Notice: Subject to any disclaimer, the term of this patent is extended or adjusted under 35 U.S.C. 154(b) by 0 days.

(21) Appl. No.: 10/012,547

(22) Filed: Dec. 12, 2001

(65) Prior Publication Data

US 2003/0011771 A1 Jan. 16, 2003

(30) Foreign Application Priority Data

Jul. 16, 2001 (JP) .................................. 2001-215540

(51) Int. Cl.$^7$ .......................... G03B 27/42; G03B 27/52
(52) U.S. Cl. ............................. 355/53; 355/55; 355/77
(58) Field of Search ......................... 355/53, 55, 77, 355/52; 356/237.2, 237.4, 237.5; 430/22; 250/548

(56) References Cited

U.S. PATENT DOCUMENTS 6,118,515 A * 9/2000 Wakamoto et al. ........... 355/53
6,268,903 B1 * 7/2001 Chiba et al. ................. 355/53
2002/0158185 A1 * 10/2002 Nelson et al. ............ 250/201.2

FOREIGN PATENT DOCUMENTS

JP          2001-093813        4/2001

* cited by examiner

Primary Examiner—Alan A. Mathews
(74) Attorney, Agent, or Firm—Volentine Francos, PLLC

(57) ABSTRACT

An exposure apparatus and an exposure method that minimize the range over which exposing light becomes defocused even when a non-level portion is present within each shot are provided. One shot is selected from a plurality of shots (exposure unit areas) set on a wafer (S 50). 49 measurement points are set in the selected shot and the three-dimensional coordinates of each measurement point are determined (S 70). Next, an arithmetic operation is performed using the 49 sets of three-dimensional coordinate data to ascertain an "in-shot focus plane" (S 90). This arithmetic operation may be performed through, for instance, the method of least squares. The extents of positional deviation between the surface of the selected shot and the in-shot focus plane is ascertained and the extents of deviation are stored in memory as "adjustment values" (S 110). An exposure shot to undergo exposure processing is selected and the surface level variation manifesting at the exposure shot is measured. The adjustment values are subtracted from the results of the measurement and exposing light is irradiated on the exposure shot while moving the wafer along the vertical direction in conformance to the result of the subtraction (S 130).

17 Claims, 11 Drawing Sheets

EXPOSURE APPARATUS AND EXPOSURE METHOD

BACKGROUND OF THE INVENTION

1. Field of the Invention

The present invention relates to an exposure apparatus and an exposure method.

2. Description of the Related Art

During a photolithography process, which is one of the manufacturing processes implemented to manufacture semiconductor devices, a reduction projection exposure apparatus (stepper) is utilized. In keeping with the miniaturization of semiconductor devices achieved in recent years, rigorous efforts are made to reduce the wavelength of the exposing light and to achieve a higher NA (numerical aperture) in the stepper.

The relationship between the resolving power R of the stepper and the depth of focus (DOF) is expressed through a Rayleigh formulae presented below.

$$R = k_1 * \lambda / NA$$

$$DOF = k_2 * \lambda / (NA)^2$$

As these formulae clearly indicate, the focal depth DOF becomes reduced if the wavelength $\lambda$ of the exposing light is reduced or the numerical aperture NA is increased to improve the resolving power R. Since the focal depth DOF of the stepper is now achieved in the same order as that of the surface level variation of the semiconductor device, it is necessary to take measures with regard to the defocusing of the exposing light manifesting, in particular, in an area that is not level (an indented area or a projected area), in order to maintain a specific degree of dimensional accuracy for the transfer pattern.

The so-called leveling technology achieved by moving the wafer vertically in correspondence to the surface level variation or even by tilting the exposure surface in some cases during the exposure operation is normally adopted to address the problem discussed above. A surface level variation may be detected by a focus sensor provided in the stepper to measure the distance between the surface of the semiconductor device and a reference position (e.g., the exposing light source) and it may then be expressed with a three-dimensional coordinate system.

In addition, an exposure method achieved by dividing the entire wafer into a plurality of unit areas (hereafter referred to as "shots") and irradiating slit light on each shot while scanning the slit light is usually adopted in the exposure process in recent years. The range over which the slit light is irradiated is normally approximately 1/10 of the entire shot and, by scanning this light, the entire shot becomes exposed.

Adoption of such a scanning method in the exposure process may prove problematic, particularly if non-level portions attributable to the circuit structure are systematically present within the individual shots. If, during the exposure operation, the focal length is adjusted at such a non-level portion, which often manifests a drastic difference in the height relative to the surrounding area, the likelihood of the exposing light becoming defocused over a wide range at the surrounding area increases.

Since the results of measurement performed by the focus sensor are directly utilized in the wafer leveling operation during the scanning exposure process in the related art, a defocus area is formed over a wide range if the measurement point at which the focus sensor performs the measurement hits upon a non-level position, which will result in poorer dimensional accuracy of the transfer pattern.

SUMMARY OF THE INVENTION

An object of the present invention, which has been completed by addressing the problems discussed above, is to provide an exposure apparatus and an exposure method that make it possible to minimize the range over which the exposing light is defocused even when an non-level portion is included within each shot.

In order to achieve the object described above, in a first aspect of the present invention, an exposure method achieved by sequentially exposing a plurality of unit areas set in advance at the surface of a wafer is provided.

A first feature that characterizes the exposure method according to the present invention is that a pre-exposure process is implemented prior to exposure processing implemented on individual unit areas. During this pre-exposure process, one or a plurality of measurement target unit areas are selected from the unit areas and a "virtual surface" and "adjustment values" are calculated in correspondence to the three-dimensional coordinates indicating the position of the surface in each measurement target unit area.

In a first exposure method according to the present invention, one of the plurality of unit areas is set as a measurement target unit area in a first pre-exposure step, the three-dimensional coordinates of a plurality of measurement points at the surface in the measurement target unit area are determined in a second pre-exposure step and a virtual surface approximating the surface in the measurement target unit area is ascertained by using the three-dimensional coordinates of each measurement point in a third pre-exposure step. It is desirable to calculate the virtual surface through, for instance, the methods of least squares.

In a fourth pre-exposure step implemented next, the surface in the measurement target unit area is scanned by a plurality of sensors and the extents to which the individual scanning areas within the measurement target unit area scanned by the sensors are deviation from the virtual surface along a direction in which a specific coordinate axis extends are determined. The extents of the positional deviation manifesting at the respective scanning areas are stored in memory as adjustment values for the individual sensors, each corresponding to one of the scanning areas at, for instance, the controller of the exposure apparatus. It is to be noted that if a Z axis represents the optical axis of the exposing light, the extents of positional deviation can be expressed as a difference in the Z coordinate value.

When these pre-exposure steps are completed, a sensor selection step is implemented. In the first exposure method according to the present invention, at least two sensors among a plurality of sensors are selected. In a second exposure method according to the present invention, at least two sensors with their adjustment values having the smallest absolute values are selected from a plurality of sensors.

According to the present invention, an exposure unit area setting step is implemented. In this step, one of the plurality of unit areas is set as the exposure unit area to undergo the exposure processing. This step may be implemented any time prior to the exposure step. For instance, a plurality of unit areas may be set on the wafer, all the unit areas may be set as an exposure unit areas and the order in which they are to be exposed may be specified before the pre-exposure process.

In the second exposure method according to the present invention, a virtual surface and adjustment values are obtained through steps which are different from those implemented in the first exposure method according to the present invention. Namely, one of the plurality of unit areas is set as a measurement target unit area in a first pre-exposure step, and then in a second pre-exposure step, the surface in the measurement target unit area is scanned by a plurality of sensors and the three-dimensional coordinates of the individual scanning areas within the measurement target unit area having been scanned by the sensors are ascertained. In a third pre-exposure step, a virtual surface approximating the surface in the measurement target unit area is ascertained by using the three-dimensional coordinates of the scanning areas.

In a fourth pre-exposure step implemented next, the extents to which the individual scanning areas within the measurement target unit area having been scanned by the sensors in the second pre-exposure step are deviation relative to the virtual surface along a direction in which a specific coordinate axis extends are determined. The extents of the positional deviation manifested at the scanning areas are stored in memory as adjustment values for the individual sensors each corresponding to one of the scanning areas.

In addition, in a third exposure method according to the present invention, a virtual surface and adjustment values are obtained through steps which are different from those implemented in the first and second exposure methods according to the present invention. Namely, in a first pre-exposure step, one of the plurality of unit areas is set as a measurement target unit area, in a second pre-exposure step, the three-dimensional coordinates of a plurality of measurement points at the surface in the measurement target unit area are ascertained and in a third pre-exposure step, a virtual surface approximating the surface in the measurement target unit area is ascertained by using the three-dimensional coordinates of the individual measurement points.

In a fourth pre-exposure step implemented next, the positions of at least two sensors relative to the measurement target unit area are adjusted. When three or more sensors are present, too, it is crucial that the positions of the two sensors determined to be necessary for leveling the wafer during the exposure step be adjusted. It is to be noted that a positional adjustment may be implemented for three or more sensors and no problem will arise during the subsequent exposure process from performing such a positional adjustment. The positions of the two or more sensors are adjusted so that when the two or more sensors scan the surface in the measurement target unit area, the extents of positional deviation between the individual scanning areas scanned by the sensors and the virtual surface along the direction in which the specific coordinate axis extends are minimized. Then, in a fifth pre-exposure step, the extents of the positional deviation of the scanning areas scanned by the two or more sensors having undergone the positional adjustment are stored in memory as adjustment values for the corresponding sensors.

As described above, in the first, second and third exposure methods according to the present invention, the "adjustment values" are obtained through the pre-exposure steps. In fourth and fifth exposure methods according to the present invention, on the other hand, a plurality of measurement target unit areas are selected from a plurality of unit areas and are set, and the second pre-exposure step~fourth pre-exposure step are implemented on each of the measurement target unit areas to obtain "adjustment values" for the individual measurement target unit areas. Then, in a fifth pre-exposure step, "average adjustment values" are calculated based upon the adjustment values. Since an adjustment value is used for the wafer leveling control in the exposure step, the accuracy of the adjustment value affects the leveling accuracy. For this reason, the use of the "average adjustment values", which are obtained by measuring a plurality of measurement target unit areas and contain a small measurement error, for the wafer leveling control improves the leveling accuracy.

A second feature that characterizes the exposure method according to the present invention is that an exposure step during which the wafer is leveled by using an "adjustment value" obtained through the pre-exposure steps is implemented.

In the first, second, fourth and fifth exposure methods according to the present invention, the three-dimensional coordinates at the surface of an exposure unit area are measured by some of or all of at least two sensors selected in the sensor selection step. In the third exposure method according to the present invention, the three-dimensional coordinates at the surface of an exposure unit area are ascertained through measurement by some of or all of at least two sensors the positions of which have been adjusted in the fourth pre-exposure step. In any one of these exposure methods, by using the individual adjustment values in processing the results of the measurement by the corresponding sensors (e.g., by subtracting the adjustment values), adjustment results are obtained.

While wafer leveling is implemented in order to reduce the extent to which exposing light becomes defocused when the exposing light is irradiated on the exposure unit area, the presence of a raised area may cause the wafer to be tilted to an excessive degree if the results of the measurement performed by the sensors are directly used in the leveling operation, to result in a wider defocus range. However, the wafer leveling operation is performed using the adjustment results achieved based upon the sensor measurement results and the adjustment values. Since the adjustment values are obtained in relation to the virtual surface, the wafer is leveled in conformance to the virtual surface obtained through the calculation rather than the state of the actual surface of the exposure unit area during the exposure operation. As a result, even if there is a raised area in the exposure unit area, the wafer is not allowed to be tilted to an excessive degree, thereby minimizing the extents of defocusing of the exposing light.

According to the present invention, even if it is not possible to measure the three-dimensional coordinates at the surface of the exposure unit area with two or more sensors simultaneously, the wafer is leveled in the exposure step based upon the adjustment results achieved in conformance to the measurement results obtained by the sensor(s) capable of measuring the three-dimensional coordinates at the surface of the exposure unit area alone. Thus, the extents of defocusing of the a exposing light in the exposure unit area is reduced. In addition, it is desirable to select two or more sensors that are capable of measuring the three-dimensional coordinates the of the surface of the exposure unit area at all times while exposing light is irradiated on the exposure unit area during the exposure step and are set over a largest distance from each other in the sensor selection step. The selection of such sensors achieves stabilization of the wafer leveling operation performed during the exposure processing.

According to the present invention, a calculation-exempt area is set in a measurement target unit area. By setting the calculation-exempt area so as to contain a raised portion present in the unit area, it is possible to almost completely match the virtual surface ascertained through the pre-exposure steps with the actual surface of the measurement target unit area (excluding the calculation-exempt area) and an adjustment value close to zero is obtained. If the adjustment value is small, the calculation error and the measurement error contained therein are also reduced, and ultimately, the accuracy of the wafer leveling control implemented in the exposure step improves.

It is desirable to first ascertain a temporary virtual surface, compare the temporary virtual surface to the values obtained through actual measurement and obtain a final virtual surface by excluding a measurement point manifesting a large deviation during the pre-exposure steps. The virtual surface thus obtained almost completely matches the actual surface of the measurement target unit area and thus, an adjustment value close to zero is obtained. If the adjustment value is small, the calculation error and the measurement error contained therein are reduced and, as a result, the accuracy of the wafer leveling control implemented in the exposure step improves. By adopting this method, the need to set a calculation-exempt area is eliminated.

When exposing a plurality of wafers, the pre-exposure steps may be implemented on one wafer at a time, or the pre-exposure steps may be implemented in units of two or more wafers at a time or over specific time intervals. While the first method makes it possible to adjust for any inconsistency manifesting among manufactured wafers, a reduction in the length of time required to implement the exposure processing on the entire wafer lot is achieved by adopting the latter method.

In a second aspect of the present invention, an exposure apparatus for exposing a wafer is provided. This exposure apparatus comprises one or a plurality of sensors capable of Determining three-dimensional coordinates of a plurality of measurement points at the surface of the wafer and a controller capable of ascertaining a virtual surface approximating the surface of the wafer by using the three-dimensional coordinates of the individual measurement points. This structure enables a wafer leveling operation to be performed in conformance to the virtual surface when exposing the wafer.

When one or a plurality of sensors are capable of scanning the wafer surface, the three-dimensional coordinates obtained at a greater number of measurement points on the wafer can be ascertained with a high degree of efficiency. If the measurement is performed at a greater number of points, the reliability of the virtual surface which is ascertained through calculation (e.g., through the method of least squares) performed in conformance to the measurement results improves.

The controller determines the extents of positional deviation of the individual scanning areas on the wafer scanned by the sensors relative to the virtual surface along a direction in which a specific coordinate axis extends and stores in memory the extents of the positional deviation of the individual scanning areas as adjustment values for the sensors each corresponding to one of the scanning areas. Then, when exposing a specific range while ascertaining through measurement the three-dimensional coordinates in the specific range of the wafer by using the sensors, adjustment results are obtained by using the adjustment values for the individual sensors in processing the three-dimensional coordinates in the specific range having been measured by the sensors. According to the present invention in which the wafer is leveled based upon the adjustment results, the wafer is not allowed to become tilted to an excessive degree even if a sensor detects an indentation or a projection at the wafer surface during the exposure operation. Consequently, the range over which the defocusing of the exposing light attributable to the presence of a raised area on the wafer manifests can be minimized.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE REFERRED EMBODIMENTS

Figure 1:
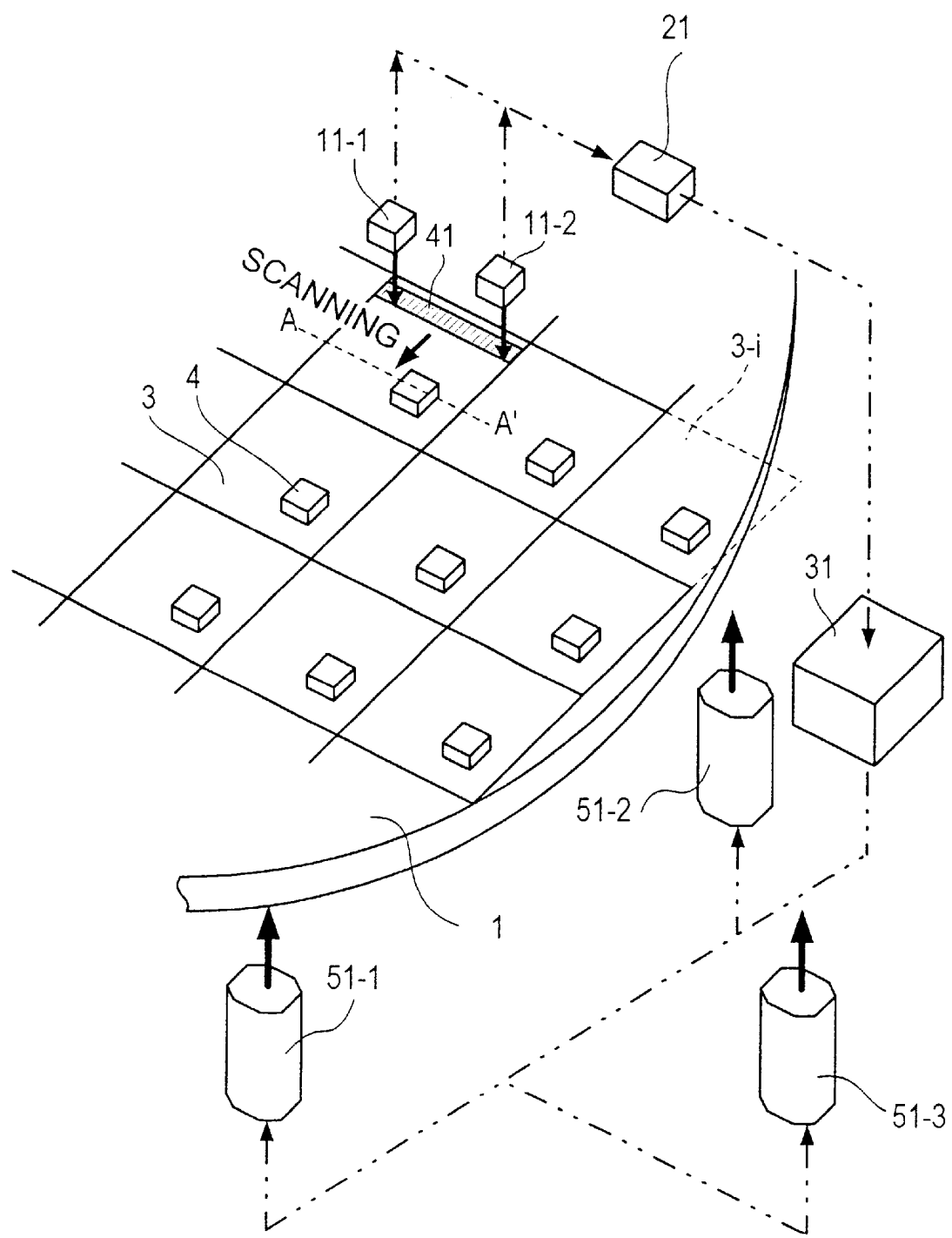
FIG. 1 is a perspective illustrating the basic structure adopted in the stepper and the positional relationship between the stepper and the wafer.

The following is a detailed explanation of the preferred embodiments of the exposure apparatus and the exposure method according to the present invention, given in reference to the attached drawings. It is to be noted that the same reference numerals are designated to components having roughly identical functions and structural features in the following explanation and the attached drawings to preclude the necessity for a repeated explanation thereof.

Figure 2:
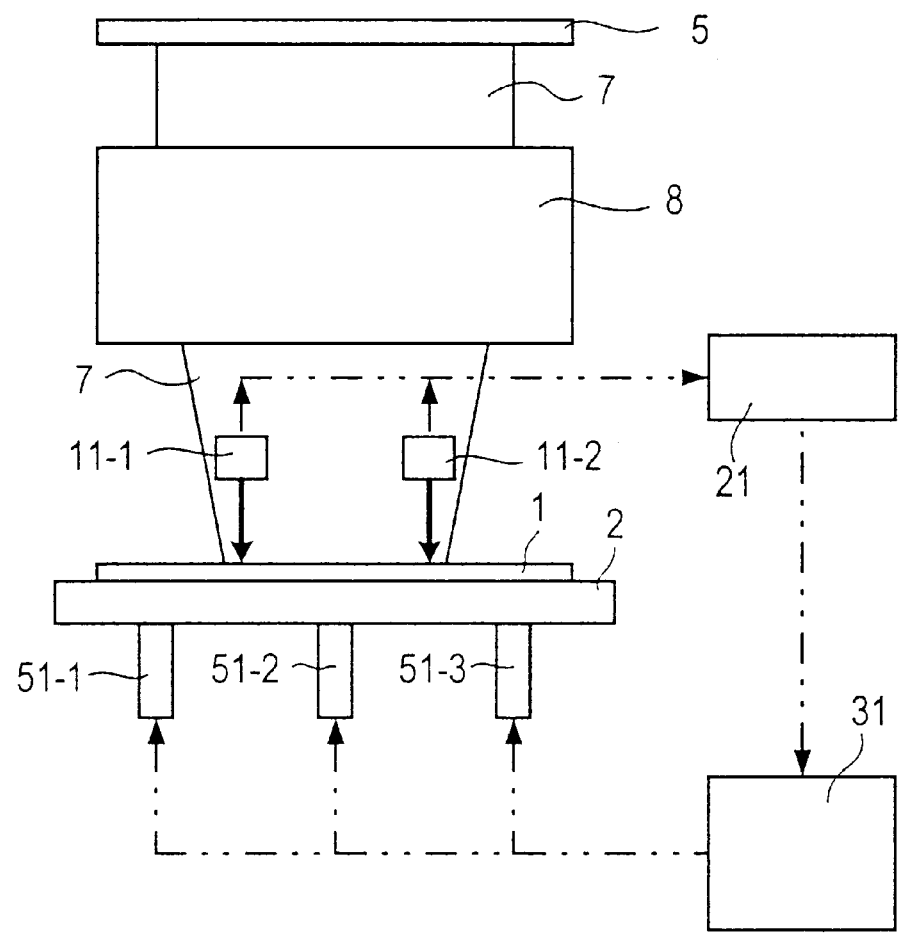
FIG. 2 is a side elevation illustrating the basic structure adopted in the stepper and the positional relationship between the stepper and the wafer.
Figure 3:
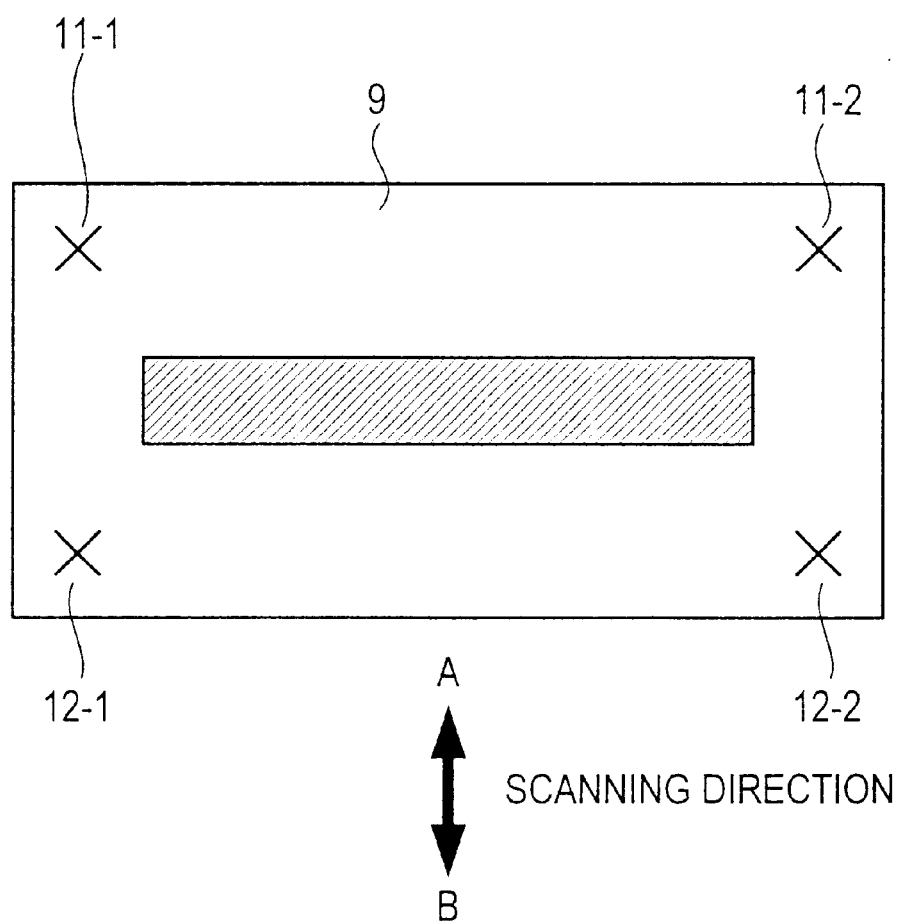
FIG. 3 is a plan view illustrating the positional relationship between standard sensor heads and an exposure slit.

First, the basic structure adopted in an exposure apparatus (stepper) which performs scanning exposure and the relationship between the the stepper and the wafer are explained in reference to FIGS. 1~3.

The surface of a wafer 1 to be exposed is partitioned into a plurality of shots 3-1~3-*n* in advance and exposure processing is implemented on a single shot 3 at a time.

This stepper is provided with a plurality of focus sensor heads (four focus sensor heads 11-1, 11-2, 12-1 and 12-2) and a focus leveling position detection unit 21 to enable it to measure the distance from a reference position (e.g., the exposing light source) to the exposure surface of the wafer 1. The focus sensor heads (hereafter referred to as the "sensor heads") 11-1, 11-2, 12-1 and 12-2 are secured to an exposure slit 9 as shown in FIG. 3. The sensor heads 11-1 and 11-2 function as a pair, and the sensor heads 12-1 and 12-2 function as a pair. The focus•leveling position detection unit 21 calculates the distance between the exposure surface and the exposing light source and the position of the exposure surface in the whole wafer 1, i.e., the three-dimensional coordinates of the exposure surface, based upon information provided from the sensor heads 11-1 and 11-2 or the sensor heads 12-1 and 12-2, and provides the calculation results to a controller 31.

The controller 31 controls the operations of actuators 51-1, 51-2 and 51-3 in conformance to the results of the arithmetic operation performed at the focus•leveling position detection unit 21 to allow the wafer 1 to move vertically together with a wafer chuck 2 holding the wafer 1.

Exposing light 7 having been emitted from the exposing light source and transmitted through a reticle 5 reaches an exposure range 41 at the wafer 1 via a projection lens 8 and the exposure slit 9. Then, the exposing light source or the wafer 1 slides to allow the exposure range 41 to move along the direction indicated by the arrow in FIG. 1. Once the exposure range 41 has moved from one end of the shot 3 to the opposite end, the exposure of the shot 3 is completed.

The sensor heads 11-1 and 11-2, and the sensor heads 12-1 and 12-2 are set so as to continuously measure the three-dimensional coordinates at two points frontward along the direction in which the exposure range 41 moves during the exposure scanning operation. As shown in FIG. 3, when the scanning operation is performed along direction A, the sensor heads 11-1 and 11-2 are engaged whereas when the scanning operation is performed along direction B, the sensor heads 12-1 and 12-2 are engaged. Equipped with the sensor heads 11-1, 11-2, 12-1 and 12-2, the stepper moves the wafer 1 vertically or, in some cases, tilts the wafer 1 by controlling the operations of the actuators 51-1, 51-2 and 51-3 immediately before the exposure operation in conformance to the contour of the surface to be exposed. If the wafer 1 is allowed to move vertically and to tilt in conformance to the contour of the surface of the exposure range 41, major part of the exposure range 41 can be largely matched the focal depth even when the focal depth DOF is extremely small.

Figure 4:
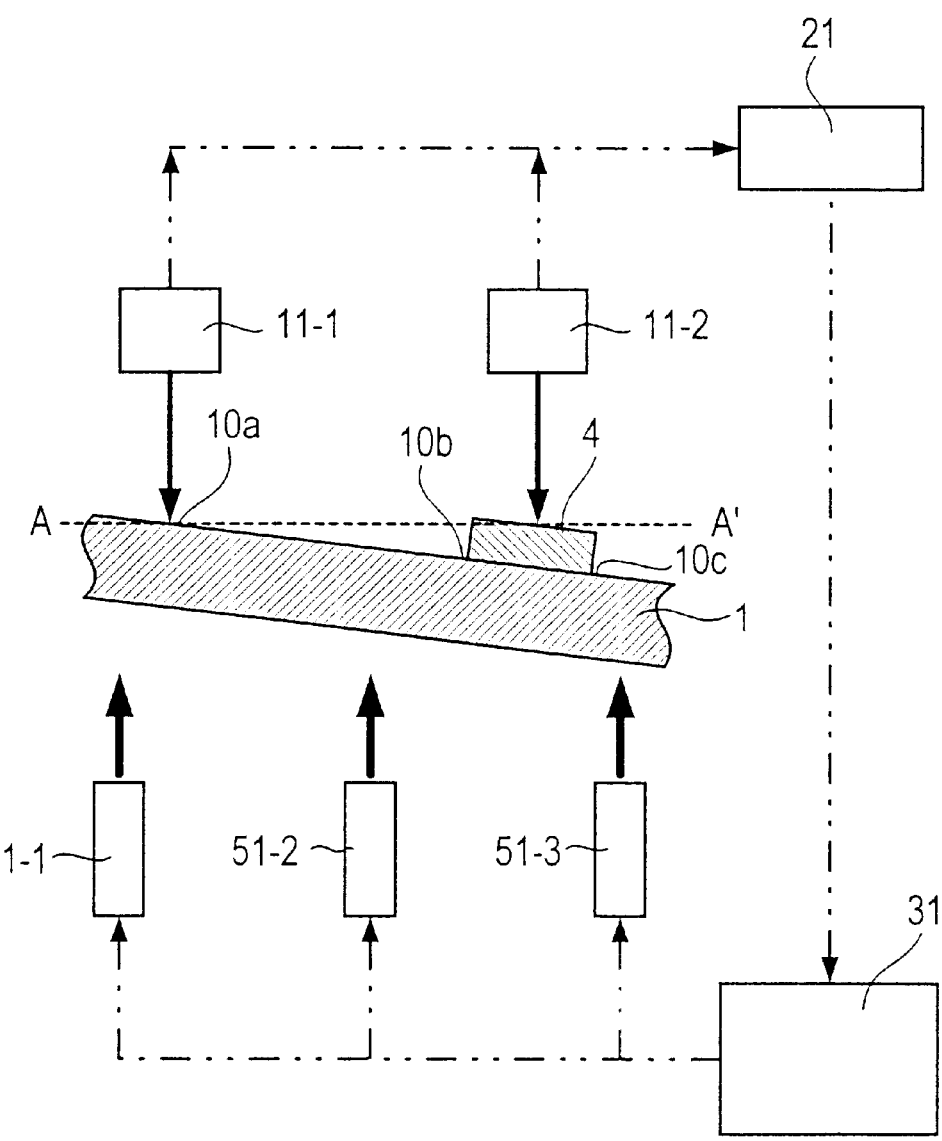
FIG. 4 is a side view of a defocus area manifesting at a leveled wafer.

As shown in FIG. 1, each of the shots 3-1~3-n may include a projected portion 4 manifesting a difference in height relative to the surrounding area due to the particulars of the circuit structure. The following problems may occur particularly if the upper surface of the projected portion 4 is discontinuous to the surface of the surrounding area. An explanation is now given in reference to FIG. 4.

After the measurement point of the sensor head 11-1 passes over the surface of a surrounding area 10a and, at the same time, the measurement point of the sensor head 11-2 passes over the upper surface of the projected portion 4, the stepper tilts the wafer 1 so as to match the surface of the surrounding area 10a and the upper surface of the projected portion 4 with the focal depth in preparation for exposure. This sets a surrounding area 10b and a surrounding area 10c of the projected portion 4 at positions deeper than the focal depth causing the exposing light to become greatly defocused in the surrounding areas 10b and 10c. When a minute pattern is formed at the surrounding areas 10b and 10c, this exposing light defocus phenomenon results in a defect in the semiconductor device product. A similar problem occurs when an indented portion is present within the shot instead of the projected portion 4.

In addition, while the shots 3-1~3-n are defined in rectangular shapes identical to one another in principle, a shot 3-i at an edge of the wafer 1 is formed in a shape with a portion of the rectangle missing (a so-called "incomplete shot"). While exposing an incomplete shot, the measurement point of either of the two sensor heads 11-1 and 11-2 may be set off the wafer 1, thereby disabling the leveling operation on the wafer 1. If the wafer 1 cannot be leveled while exposing the shot 3-i, the likelihood of the exposing light becoming defocused at the shot 3-i becomes high.

These problems are solved by the present invention. The following is a detailed explanation of the embodiments of the present invention.

(First Embodiment)

The stepper and the exposure method achieved in the first embodiment of the present invention are explained. It is to be noted that the stepper in the embodiment assumes a structure equivalent to that of the stepper shown in FIGS. 1~3 except for in the components explained below.

Figure 5:
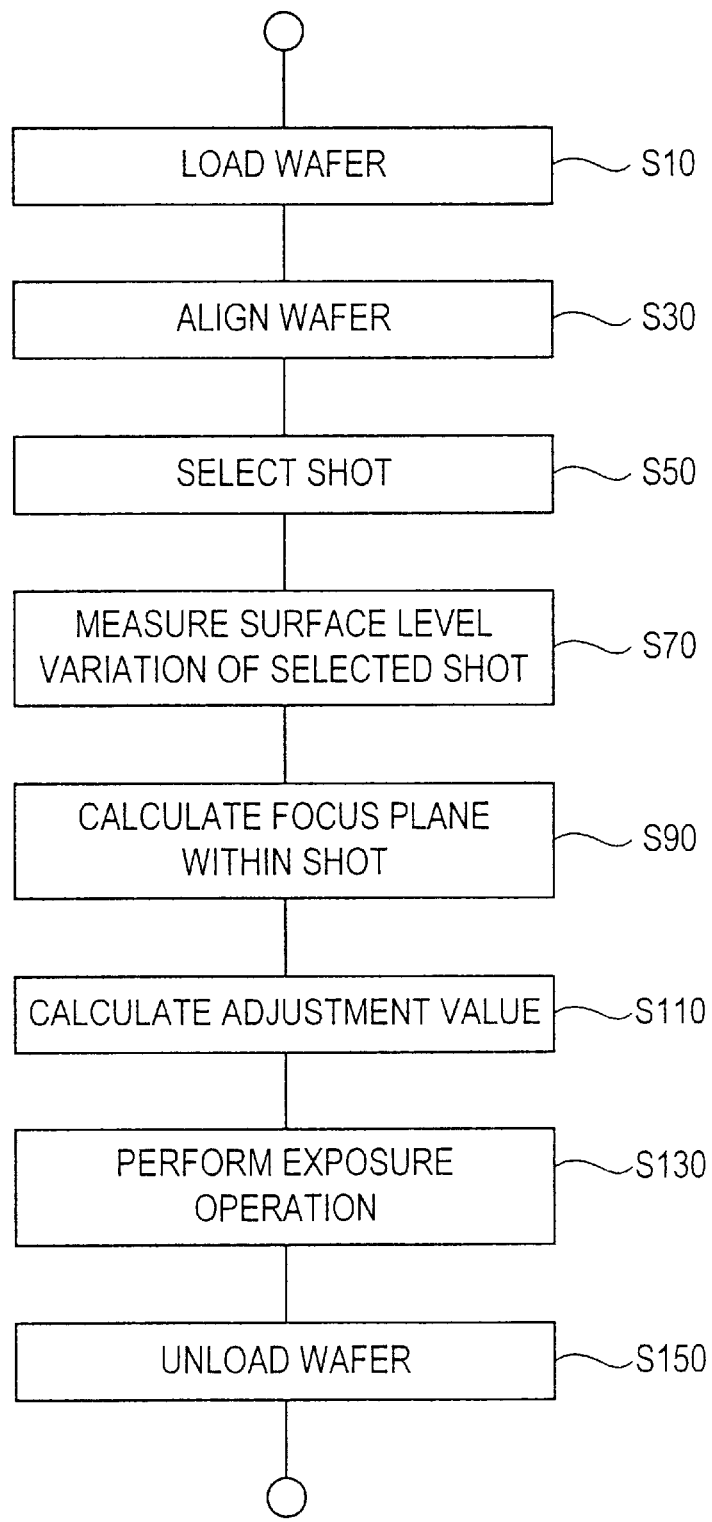
FIG. 5 is a flowchart of the steps implemented in the exposure of method achieved in a first embodiment of the present invention.
Figure 6:
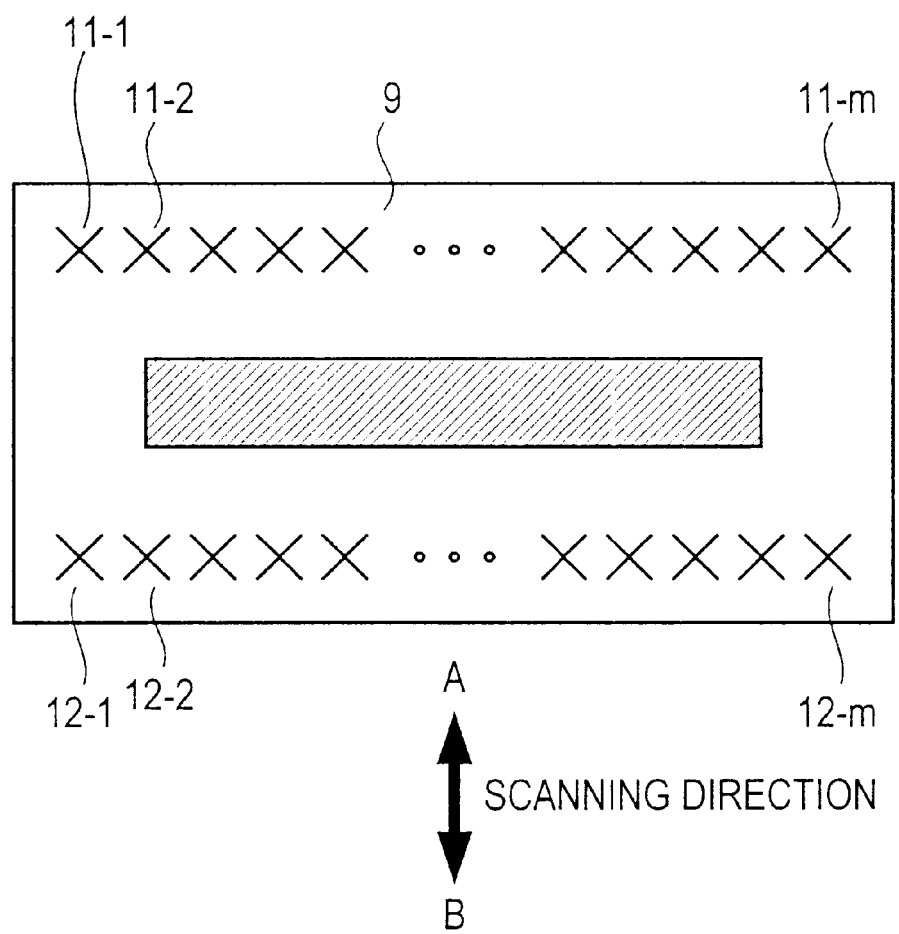
FIG. 6 is a plan view illustrating the positional relationship between the sensor heads provided in the stepper in a second embodiment of the present invention and the exposure slit.

FIG. 5 is a flowchart provided to facilitate an explanation of the individual steps implemented in the exposure method in the embodiment. The following is the explanation of the individual steps taken in the exposure method in the embodiment.

First, the wafer 1 is loaded at the stepper (step S10) and the loaded wafer 1 is then aligned (step S30).

Next, one shot (measurement target unit area) 3-k is selected from the shots 3-1~3-n (step S50). At this time, incomplete shots including the shot 3-i are excluded from the selection.

One sensor head, e.g., the sensor head 11-1, is selected from the four sensor heads 11-1, 11-2, 12-1 and 12-2 secured to the exposure slit 9. Utilizing the sensor head 11-1, the surface level variation manifesting at the shot 3-k is measured (step S70). This may be achieved by, for instance, dividing the shot 3-k into 7 (rows)×7 (columns) measurement areas (49 measurement areas) achieving a matrix form. Then, the distances from a reference position (e.g., the exposing light source) to the centers of the individual measurement areas are measured by the sensor head 11-1. As a result, three-dimensional coordinate data with regard to the 49 measurement points are calculated at the focus•leveling position detection unit 21. These data are input to the controller 31.

The controller 31 performs an arithmetic operation using the 49 sets of three-dimensional coordinate data and obtains an "in-shot focus plane" (step S90). It is desirable to adopt, for instance, the method of least squares when performing this arithmetic operation. The virtual in-shot focus plane ascertained in this step is stored at the controller 31.

Next, as in a normal exposure operation, the surface level variation manifesting at the selected shot 3-k is measured while moving the sensor heads 11-1 and 11-2 (or the sensor heads 12-1 and 12-2) rectilinearly from one end of the selected shot 3-k to the opposite end. More specifically, the distance from the reference position to the rectilinear area (hereafter referred to as the "linear area") scanned by the sensor heads 11-1 and 11-2 is measured. Then, the controller 31 calculates the difference between the distance from the reference position to the linear area and the distance from the reference position to the area contained in the focus plane within the shot that corresponds to the linear area and stores in memory the results of the calculation as an "adjustment value" (step S110). When the optical axis of the exposing light is set as a Z axis, this adjustment value is equivalent to the extents of positional deviation manifesting between the linear area and the in-shot focus plane along the direction in which the Z axis extends.

Then, exposure processing is sequentially implemented on all the shots 3-1~3-n. As in a normal exposure operation, each shot 3 is exposed by measuring the surface level variation (three-dimensional coordinates) at the shot 3 with the sensor heads 11-1 and 11-2 (or the sensor heads 12-1 and 12-2) moving from one end of the shot 3 to the opposite end and leveling the wafer 1 rectilinearly in correspondence to the results of the measurement. It is to be noted, however, that the controller 31 subtracts the adjustment values obtained in step S110 from the results of the measurement performed by the sensor heads 11-1 and 11-2 and moves the wafer 1 along the vertical direction in conformance to the results of the subtraction (step S130).

When the exposure processing on all the shots 3-1~3-n is completed, the wafer 1 is unloaded from the stepper (step S150).

As explained above, in the stepper and the exposure method in the first embodiment, the wafer 1 is not allowed to move along the vertical direction in direct conformance to the surface level variation manifesting at the linear areas measured by the sensor heads 11-1 and 11-2 when exposing each of the shots 3-1~3-n. Namely, the measurement results are adjusted by using the adjustment values first and then the wafer 1 is allowed to move along the vertical direction in conformance to the results of the adjustment. Thus, even when there is a non-level portion (the projected portion 4 or an indented portion) present within the shot 3, the wafer 1 is not leveled in alignment with the upper surface of the non-level portion during the exposure and, as a result, the extents of defocusing occurring around the non-level portion is reduced.

(Second Embodiment)

Next, the stepper and the exposure method achieved in the second embodiment of the present invention are explained.

The stepper in the second embodiment is provided with a greater number of photosensor heads compared to the stepper achieved in the first embodiment. More specifically, it includes m sensor heads 11-1~11-m which are engaged in operation when the scanning operation is performed along direction A and m sensor heads 12-1~12-m which are engaged in operation when the scanning operation is performed along direction B, all provided at the exposure slit 9. It is to be noted that the sensor head 11-1 and the sensor head 12-1 are set on a single line extending along the scanning direction, and that the remaining sensor heads a 11-2~11-m and sensor heads 12-2~12-m respectively achieve the same positional relationship.

Figure 7:
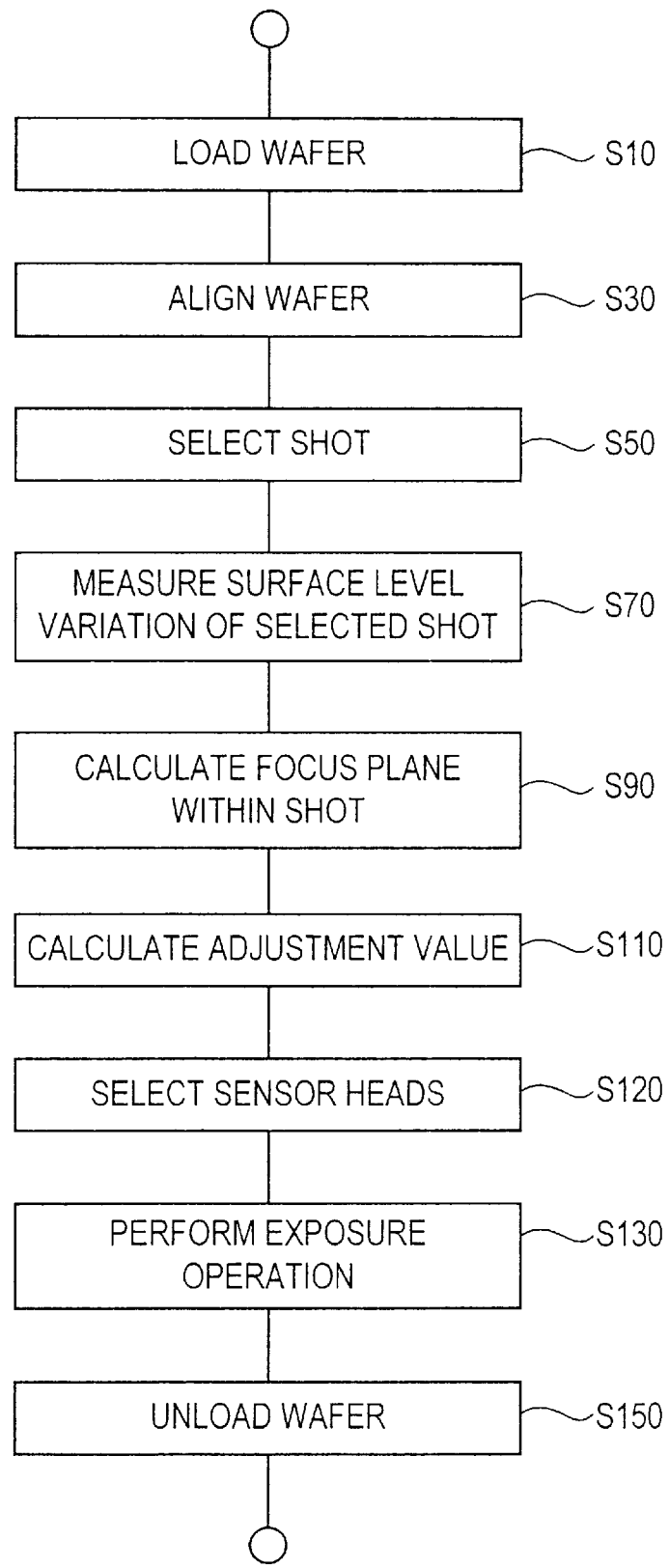
FIG. 7 is a flowchart of the steps implemented in the exposure method achieved in the second embodiment of the present invention.

FIG. 7 is a flowchart provided to facilitate an explanation of the individual steps implemented in the exposure method in the embodiment. The following is the explanation of the individual steps taken in the exposure method in the embodiment.

First, the wafer 1 is loaded at the stepper (step S10) and the loaded wafer 1 is then aligned (step S30).

Next, one shot 3-k is selected from the shots 3-1~3-n (step S50). At this time, incomplete shots including the shot 3-i are excluded from the selection.

Next, the surface level variation in the selected shot is measured (step S70). While this step is also executed in the exposure method in the first embodiment, the specific method of measurement adopted in the second embodiment is different. To explain this in further detail, the selected shot 3-k is scanned by using all of the m sensor heads 11-1~11-m (or all of the m sensor heads 12-1~12-m). At this time, the individual sensor heads 11-1~11-m measure the distances between the corresponding linear areas and the reference position (e.g., the exposing light source) with continuity. Then, three-dimensional coordinate data with regard to the m linear areas are calculated at the focus leveling position detection unit 21. These sets of data, which can be represented as a curve that is continuous along the scanning direction, are input to the controller 31.

The controller 31 performs an arithmetic operation using the m sets of three-dimensional coordinate data and obtains an "in-shot focus plane" (step S90). It is desirable to adopt, for instance, the method of least squares when performing this arithmetic operation. The virtual in-shot focus plane ascertained in this step is stored and the controller 31. While a virtual surface (the in-shot focus plane) is ascertained by using the 49 sets of "point data" in step S90 in the exposure method in the first embodiment, the virtual surface is ascertained based upon the m sets of "curve data" and the exposure method in this embodiment. As a result, the reliability of the virtual surface ascertained through the calculation improves.

Then, the controller 31 calculates the differences between the distances from the reference position to the m linear areas and the distances from the reference position to the areas contained in the in-shot focus plane corresponding to the m linear areas and stores in memory the results of the calculation as "adjustment values" (step S110).

Next, a sensor head selection step (step S120) is implemented. This step is not implemented in the exposure method in the first embodiment. The selection is made as described below.

First, the m sets of three-dimensional coordinate data (curve data) obtained in step S70 are compared with the in-shot focus plane ascertained in step S90. With the Z axis representing the optical axis of the exposing light, the two sets of three-dimensional coordinate data indicating Z coordinate values that match the Z coordinate values at the in-shot focus plane or are closest to the Z coordinate values at the in-shot focus plane are selected. Then, the sensor heads corresponding to the two sets of three-dimensional coordinate data are designated as selected sensor heads. If three or more sets of three-dimensional coordinate data indicate positions that are equally close to the in-shot focus plane, the two sensor heads set apart from each other over the greatest distance among the sensor heads corresponding to the 3 or more sets of three-dimensional coordinate data are designated as selected sensor heads. For instance, the sensor head 11-1 and the sensor head 11-m are selected from three sensor heads 11-1, 11-4 and 11-n. It is to be noted that while an explanation is given above on an example in which the selection is made from the sensor heads 11-1~11-m, the sensor heads 11-1~11-m or the sensor heads 12-1~12-m are used depending upon the scanning direction, and accordingly, the selection of the sensor heads 11-1 and 11-m also means that the sensor heads 12-1 and 12-m are selected at the same time, for instance.

Then, exposure processing is sequentially implemented on all the shots 3-1~3-n. Each shot 3 is exposed by measuring the surface level variation (three-dimensional coordinates) of the shot 3 with the sensor heads selected in step S120, e.g., the sensor heads 11-1 and 11-m (or the sensor heads 12-1 and 12-m) rectilinearly moving from one end of the shot 3 to the opposite end and leveling the wafer 1 in correspondence to the results of the measurement. It is to be noted, however, that the controller 31 subtracts the adjustment values obtained in step S110 from the results of the measurement performed by the sensor heads 11-1 and 11-m and moves the wafer 1 along the vertical direction n conformance to the results of the subtraction (step S130).

When the exposure processing on all the shots 3-1~3-n is completed, the wafer 1 is unloaded from the stepper (step S150).

The stepper and the exposure method in the second embodiment described above achieve advantages similar to those realized in the stepper and the exposure method in the first embodiment.

While the in-shot focus plane ascertained in step S90 roughly matches the actual shot surface in three-dimensional space, there is a possibility that a significant deviation manifests between the actual shot surface and the in-shot focus plane in a non-level portion present in the shot. In other words, it may be assumed that an non-level portion is present where a great deviation manifests.

If an exposure operation is performed in step S130 while measuring the surface level variation in the shot 3 with a sensor head for scanning a linear area overlapping the non-level portion within the shot 3, the adjustment value to be used to level the wafer 1, too, becomes large. If a large adjustment value is used, a positional error will occur more readily while leveling the wafer 1.

However, in the exposure method in the embodiment, sensor heads for scanning areas manifesting only small degrees of deviation, i.e., for scanning the linear areas where no non-level area is present are selected in step S120 and then the wafer 1 is leveled in conformance to the results of the measurement performed by the selected sensor heads and the adjustment values. As a result, the accuracy with which the wafer 1 is leveled during the exposure operation improves and the extents of defocusing of the exposing light around an non-level area is further reduced.

(Third Embodiment)

The stepper and the exposure method achieved in the third embodiment of the present invention are now explained.

Figure 8:
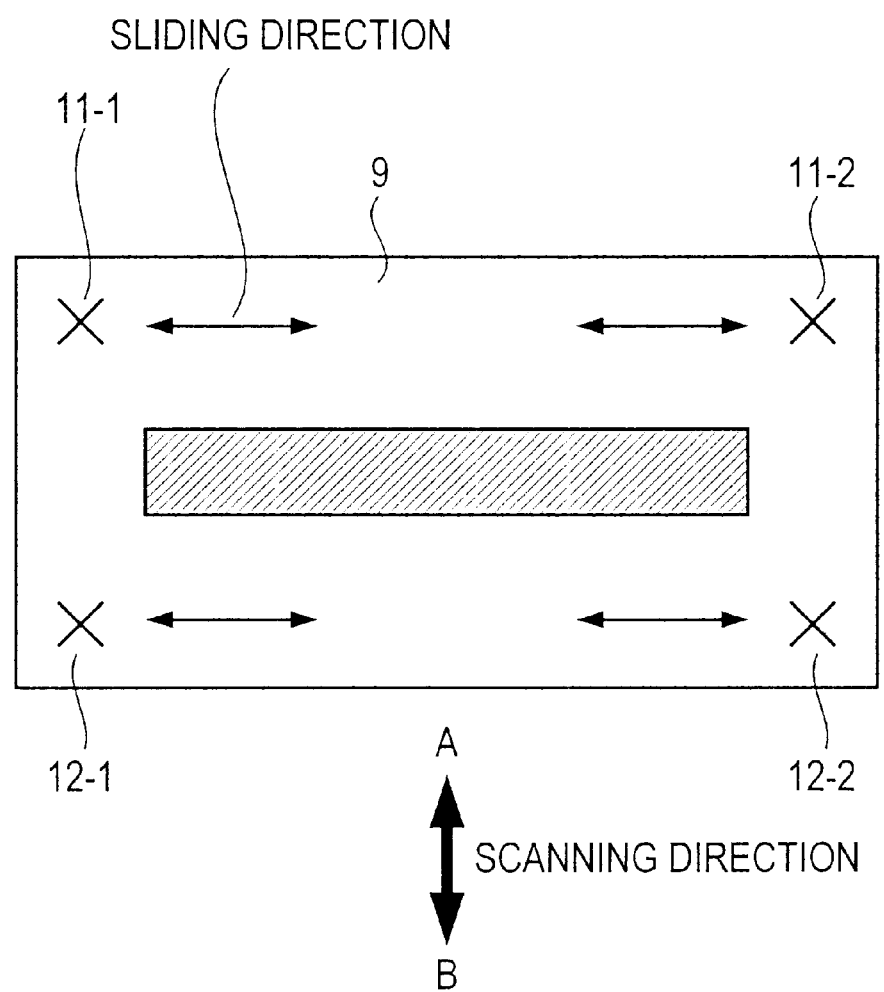
FIG. 8 is a plan view illustrating the positional relationship between the sensor heads provided in the stepper in a third embodiment of the present invention and the exposure slit.

As in the stepper in the first embodiment, four sensor heads 11-1, 11-2, 12-1 and 12-2 are provided at the exposure slit 9 in the stepper in the third embodiment. However, as illustrated in FIG. 8, the sensor heads 11-1, 11-2, 12-1 and 12-2 are each capable of moving along a direction perpendicular to the scanning direction.

Figure 9:
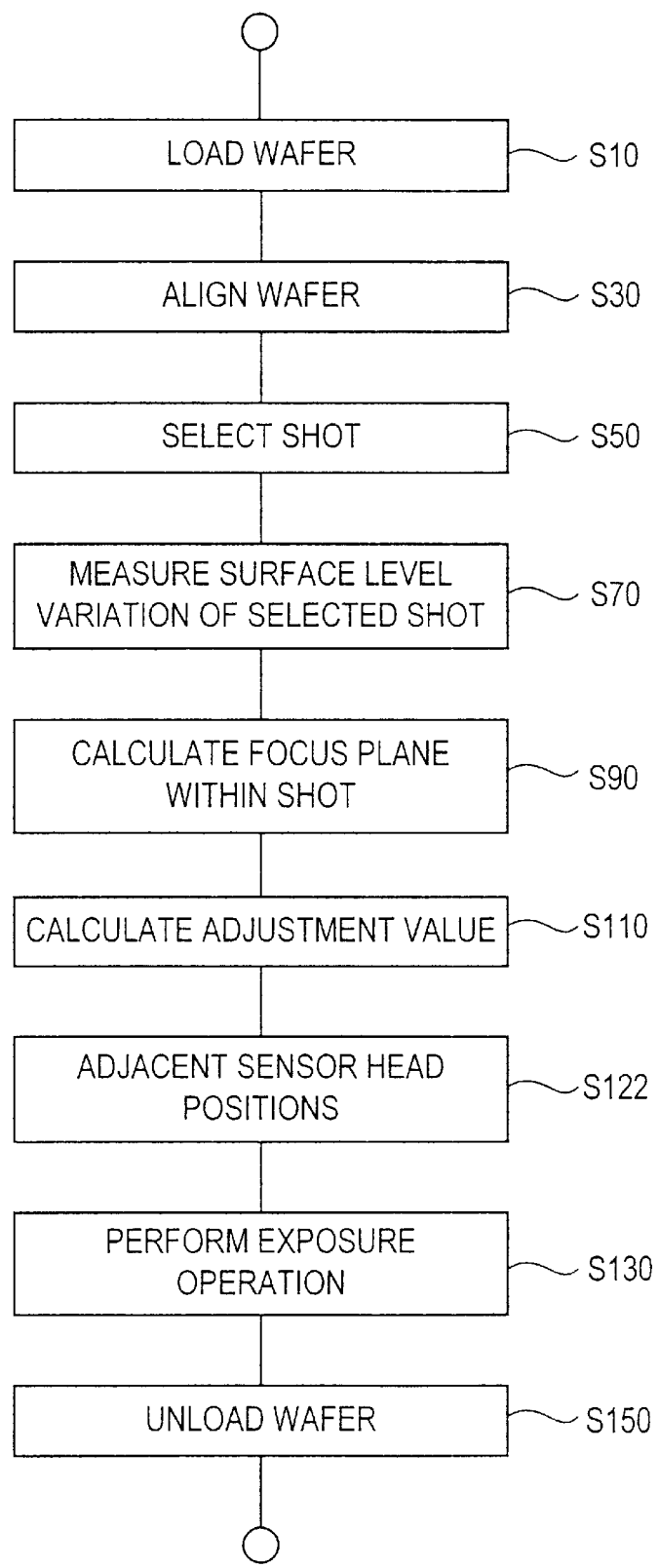
FIG. 9 is a flowchart of the steps implemented in the exposure method achieved in the third embodiment of the present invention.

FIG. 9 is a flowchart provided to facilitate an explanation of the individual steps implemented in the exposure method in the embodiment. The following is the explanation of the individual steps taken in the exposure method in the embodiment.

First, the wafer 1 is loaded at the stepper (step S10) and the loaded wafer 1 is then aligned (step S30).

Next, one shot 3-k is selected from the shots 3-1~3-n (step S50). At this time, incomplete shots including the shot 3-i are excluded from the selection.

One sensor head, e.g., the sensor head 11-1, is selected from the four sensor heads 11-1, 11-2, 12-1 and 12-2 provided at the exposure slit 9. Utilizing the sensor head 11-1, the surface level variation manifesting at the shot 3-k is measured (step S70). This may be achieved by, for instance, dividing the shot 3-k into 7 (rows)×7 (columns) measurement areas (49 measurement areas) achieving a matrix form. Then, the distances from a reference position (e.g., the exposing light source) to the centers of the individual measurement areas are measured by the sensor head 11-1. As a result, three-dimensional coordinate data with regard to the 49 measurement points are calculated at the focus•leveling position detection unit 21. These data are input to the controller 31. It is to be noted that the processing implemented in step S70 in the embodiment is essentially identical to that implemented in the exposure method in the first embodiment.

The controller 31 performs an arithmetic operation using the 49 sets of three-dimensional coordinate data and obtains an "in-shot focus plane" (step S90). It is desirable to adopt, for instance, the method of least squares when performing this arithmetic operation. The virtual in-shot focus plane ascertained in this step is stored at the controller 31.

Next, virtual loci each passing through some of the 49 measurement points the three-dimensional coordinates of which have been determined in step S70 and extending parallel to the sensor head scanning direction are ascertained. Since the measurement points are set over 7 (rows)×7 (columns) along the scanning direction in this example, there are 7 such loci. The controller 31 calculates the extents of deviation of these 7 loci relative to the in-shot focus plane ascertained in step S90 along the Z axis (along the direction in which the optical axis of the exposing light extends). Then, two loci manifesting the least deviations (preferably manifesting no deviation) are selected and the extents of deviation that these two loci manifest are stored in memory as "adjustment values" (step S110). It is to be noted that if three or more loci manifest equal degrees of deviation relative to the focus plane within the shot, two loci with the greatest distance from each other are selected.

The sensor heads 11-1, 11-2, 12-1 and 12-2 are made to slide and are positioned so as to align the measurement points along the two loci selected in step S110 when a scanning operation is performed with the sensor heads 11-1, 11-2, 12-1 and 12-2 (step S122). As a result, the positional misalignments manifesting between a linear area scanned by the sensor heads 11-1, 11-2, 12-1 and 12-2 and the in-shot focus plane are greatly reduced.

Then, exposure processing is sequentially implemented on all the shots 3-1~3-n. Each shot 3 is exposed by measuring the surface level variation at the shot 3 with the sensor heads 11-1 and 11-2 (or the sensor heads 12-1 and 12-2) the positions of which have been adjusted in step S120 rectilinearly moving from one end of the shot 3 to the opposite end and leveling the wafer 1 in correspondence to the results of the measurement. It is to be noted, however, that the controller 31 subtracts the adjustment values obtained in step S110 from the results of the measurement performed by the sensor heads 11-1 and 11-2 and moves the wafer 1 along the vertical direction in conformance to the results of the subtraction (step S130).

When the exposure processing on all the shots 3-1~3-n is completed, the wafer 1 is unloaded from the stepper (step S150).

The stepper and the exposure method in the third embodiment achieve advantages similar to those realized in the stepper and the exposure method in the second embodiment. Furthermore, since it only requires a small number of sensor heads, a reduction in the production costs can be achieved.

(Fourth Embodiment)

Figure 10:
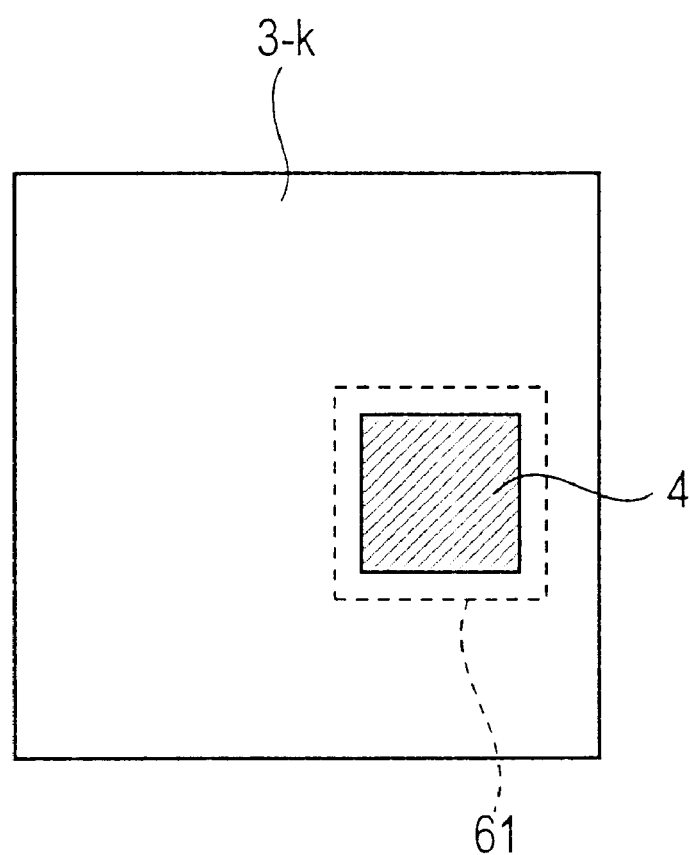
FIG. 10 is a plan view showing the calculation-exempt area set within a shot.

The fourth embodiment is achieved by adding in any of the exposure methods in the first, second and third embodiments a step in which an "in-shot focus plane calculation-exempt area (hereafter referred to as a "calculation exempt area") 61 that includes a non-level portion (a projected portion or an indented portion) present in the selected shot 3-k is set as shown in FIG. 10.

As explained earlier, the surface level variation manifesting at the selected shot 3-k is ascertained by measuring the 49 points in step S70 in the exposure methods in the first and third embodiments. However, there is a possibility that some of the 49 measurement points are set at the upper surface of the non-level portion. In such a case, a significant error may be contained in the in-shot focus plane calculated in step S90.

Due to the nature of circuit design, information indicating the positions of non-level portions to be formed at a semiconductor device can be obtained prior to production. By providing position information to the controller 31 with respect to such non-level portions, it becomes possible to set the calculation-exempt area 61 in the shot 3-*k* to exclude any measurement points located at the non-level portion from the calculation processing.

In addition, when a plurality of measurement points are uniformly set at the surface of the selected shot 3-*k* as in the exposure methods in the first and third embodiments, too, the three-dimensional coordinate data corresponding to the calculation-exempt area 61 may be disregarded when calculating the in-shot focus plane in step S90. This method may also be adopted in conjunction with the exposure method in the second embodiment.

By setting the calculation-exempt area 61 as described above, the accuracy with which the in-shot focus plane as calculated is improved. As a result, the occurrence of defocusing of the exposing light is further reduced around non-level portions present in the individual shots 3-1~3-*m*.

(Fifth Embodiment)

After calculating the in-shot focus plane in step S90 and calculating the adjustment values in step S10 as in the exposure methods in the first, second and third embodiments, the following step is implemented in the fifth embodiment.

Figure 11:
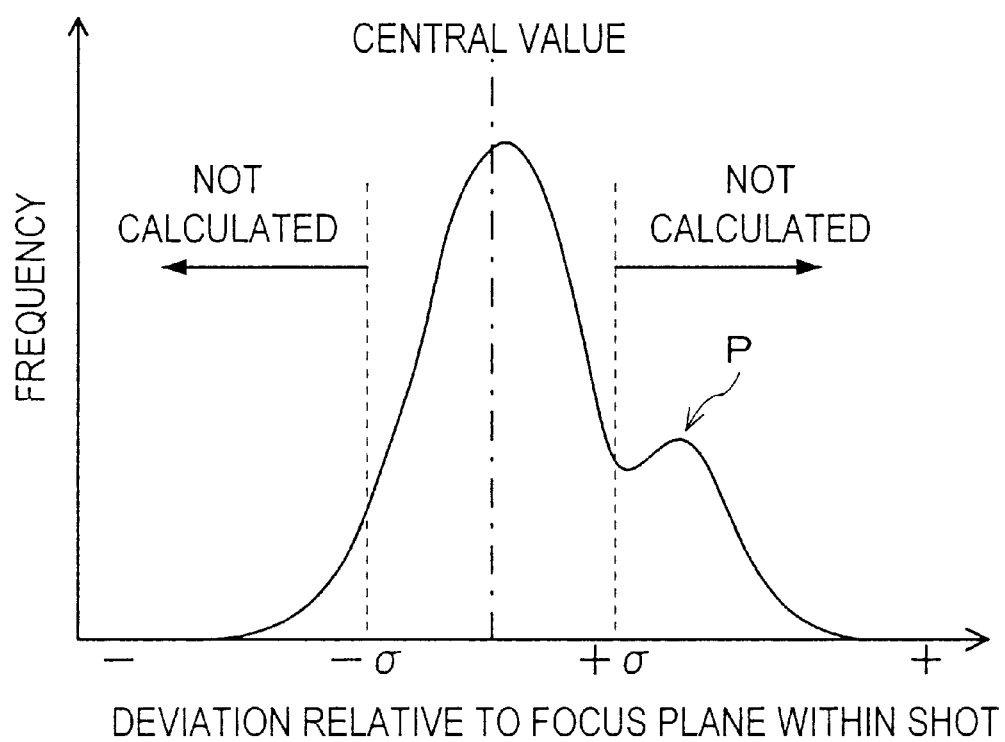
FIG. 11 is a distribution diagram showing the deviations of the individual measurement points within the shot relative to the in-shot focus plane.

FIG. 11 presents an example of a graph of the extents of deviations (deviations) of the plurality of measurement points set in step S70 relative to the in-shot focus plane (the temporary virtual surface) calculated in step S90 along the Z axis. The number (frequency) of measurement points that roughly match the virtual in-shot focus plane obtained through the method of least squares is normally the highest, with the frequency decreasing as the extent of the deviation along the + direction and the − direction increases. However, if a non-level portion is present within the shot, a peak P manifests at a position distanced from the central value as shown in FIG. 11. Accordingly, it may be assumed that the measurement point constituting the peak P manifesting in the distribution is set at a non-level portion.

Next, threshold values are set by using, for instance, the standard deviation in the distribution in FIG. 11. Then, using the data that do not exceed the threshold (the data within the range of; central value ± standard deviation σ in this example) alone, an in-shot focus plane is calculated again through the method of least squares. Subsequently, an exposure operation and the like are performed by using the in-shot focus plane (virtual surface) obtained through the second calculation.

As described above, the exposure method in the fifth embodiment makes it possible to obtain a highly accurate in-shot focus plane as does the exposure method achieved in the fourth embodiment. In addition, by adopting this method, the calculation error occurring when calculating the in-shot focus plane due to the presence of a non-level portion in the shot can be eliminated without obtaining design information in advance.

(Sixth Embodiment)

As illustrated in FIG. 1, the shots 3-1~3-*n* include an incomplete shot 3-*i* with a portion of the rectangular shape missing. The shots other than the incomplete shot 3-*i* may be exposed as in step S130 explained in reference to the first~fifth embodiments without resulting in any problems. However, if the incomplete shot 3-*i* is the exposure target, the measurement points of all the sensor heads may not always be set at the surface of the wafer 1, i.e., there may be a measurement point set off the surface of the wafer 1. In such a case, the control for the leveling operation on the wafer 1 may become disabled while the exposure operation is in progress, resulting in defocusing of the exposing light over a wide range corresponding to the incomplete shot 3-*i*.

Accordingly, prior to the start of the operation for exposing the incomplete shot 3-*i*, one sensor head, e.g., the sensor head 11-1, whose measurement point remains on the wafer 1 at all times during the scanning operation performed for exposure is selected. Then, in step S130, the surface level variation manifesting at the incomplete shot 3-*i* is measured by utilizing the selected sensor head 11-1 alone and the exposing light is irradiated on the shot 3-*i* while leveling the wafer 1 based upon the results of the measurement. It is to be noted that the controller 31 subtracts the adjustment values ascertained in step S110 from the results of the measurement performed by the sensor head 11-1 and moves the wafer 1 along the vertical direction in conformance to the results of the subtraction.

Through the exposure method achieved in the embodiment which enables a leveling operation on the wafer 1 even when the exposure target is an incomplete shot, the occurrence of defocusing of the exposing light is minimized as when exposing other shots.

(Seventh Embodiment)

When the stepper is provided with 2×m sensor heads 11-1~11-*m* and 12-1~12-*m* at the exposure slit 9 (see FIG. 7) as is the stepper in the second embodiment, the following method is adopted to perform an exposure operation on the incomplete shot 3-*i*.

Namely, a plurality of sensor heads whose measurement points remain on the wafer 1 at all times during the scanning operation performed for the exposure are selected from the m sensor heads 11-1~11-*m* (or from the m sensor heads 12-1~12-*m*) prior to the start of the exposure operation on the incomplete shot 3-*i*. Then, two sensor heads set over the largest distance from each other are selected from the plurality of sensor heads that have been selected. In step S130, the surface level variation manifesting at the incomplete shot 3-*i* is measured by utilizing the selected two sensor heads and the incomplete shot 3-*i* is exposed while leveling the wafer 1 in conformance to the results of the measurement. The controller 31 subtracts the adjustment values obtained in step S110 from the results of the measurement performed by the two sensor heads and moves the wafer 1 along the vertical direction in conformance to the results of the subtraction.

While the wafer 1 can be leveled while exposing the incomplete shot 3-*i*, the wafer only moves along the direction in which the Z axis extends and is not tilted in the tilting direction since the leveling operation is performed in reference to a single sensor head in the exposure method achieved in the sixth embodiment. However, the exposure method in this embodiment allows the wafer 1 to be tilted in the tilting direction. As a result, the occurrence of defocusing of the exposing light at the incomplete shot 3-*i* can be reduced even more effectively.

(Eighth Embodiment)

The incomplete shot 3-*i* is exposed in the following manner in a stepper having 2×2 slidable sensor heads 11-1, 11-2, 12-1 and 12-2 provided at the exposure slit 9 (see FIG. 8) as in the stepper achieved in the third embodiment.

Namely, the positions of the two sensor heads 11-1 and 11-2 (or the sensor heads 12-1 and 12-2) are made to slide so as to ensure that their measurement points remain on the wafer 1 during the scanning operation performed for exposure prior to the start of the exposure operation on the incomplete shot 3-$i$. At this time, it is desirable to set the sensor heads 11-1 and 11-2 (or the sensor heads 12-1 and 12-2) over the largest possible distance from each other. Then, in step S130, the surface level variation manifesting at the incomplete shot 3-$i$ is measured by utilizing the two sensor heads 11-1 and 11-2 (or the sensor heads 12-1 and 12-2) that have been positioned as described above and the shot 3-$i$ is exposed while leveling the wafer 1 based upon the results of the measurement. The controller 31 subtracts the adjustment values determined in step S110 from the results of the measurement performed by the two sensor heads 11-1 and 11-2 (or the sensor heads 12-1 and 12-2) and moves the wafer 1 along the vertical direction in conformance to the results of the subtraction.

As in the exposure method achieved in the seventh embodiment, the extents of defocusing of the exposing light at the incomplete shot 3-$i$ is reduced in the exposure method in the eighth embodiment.

(Ninth Embodiment)

A plurality of wafers are designated together in a single lot and the manufacturing process is managed in units of individual lots when manufacturing semiconductor devices. It is then logical to achieve more efficient process management by implementing the individual steps (hereafter referred to as the "pre-exposure steps") including the "shot selection (step S50)", the "measurement of the surface level variation at the selected shot (step S70)", the "calculation of the in-shot focus plane (step S90)" and the "calculation of the adjustment values (step S110)" in the exposure methods in the first~eighth embodiments, the "sensor head selection (step S120)" in the exposure method in the second embodiment and the "sensor head position adjustment (step S122)" in the exposure method in the third embodiment in units of individual lots rather than in units of individual wafers.

For instance, the pre-exposure steps may be implemented only on the first wafer of a lot. If, on the other hand, a single lot includes a great number of wafers, the pre-exposure steps may be implemented over specific intervals in order to assure that a specific level of wafer leveling accuracy is maintained. Such intervals may be set over specific lengths of time or over specific numbers of wafers. It is to be noted that after the in-shot focus plane and the adjustment values are obtained by implementing the pre-exposure steps on a selected shot of a given wafer, wafer leveling is performed on other wafers by using the in-shot focus plane and the adjustment values until the pre-exposure steps are implemented next.

The exposure method in the embodiment achieves advantages similar to those realized in the exposure methods in the first~eighth embodiments and, in addition, it minimizes the extent to which the processing capability of the stepper is reduced as a result of implementing the pre-exposure steps.

(Tenth Embodiment)

While a single shot among a plurality of shots within a wafer is selected and is designated as the selected shot in the exposure methods in the first~ninth embodiments, a plurality of selected shots may be designated in a wafer. In the latter case, the pre-exposure steps are implemented for each of the plurality of selected shots so that an in-shot focus plane and adjustment values are obtained in correspondence to each selected shot. Then, the averages (average adjustment values) of the adjustment values are calculated prior to the exposure operation (step S130).

In step S130, exposure processing is sequentially implemented on all the shots 3-1~3-$n$ by using the average adjustment values.

The exposure method in the embodiment achieves a higher degree of reliability inherent to the average adjustment values even when there are errors in the individual measurement and calculation processes implemented during the pre-exposure steps. As a result, the frequency with which the exposing light becomes defocused in the shots 3-1~3-$n$ is reduced.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

What is claimed is:

1. An exposure method comprising;
designating one of a plurality of unit areas on a surface of a wafer as a measurement target unit area;
finding three-dimensional coordinates of a plurality of measurement points on a surface of the measurement target unit area;
creating a virtual surface approximated to the surface of the measurement target unit area by using the three-dimensional coordinates corresponding to the measurement points;
scanning the surface of the measurement target unit area using a plurality of sensors;
finding a plurality of positional deviations along a predetermined coordinate axis between the scanned measurement target unit area and the virtual surface;
storing the positional deviations as a plurality of adjustment values for the sensors;
selecting two or more sensors from the sensors;
designating one of the unit areas as an exposure unit area to be exposed;
finding a three-dimensional coordinate of the exposure unit area by at least one of the selected sensors;
finding an adjustment result from the adjustment values and the three-dimensional coordinate of the exposure unit area; and
exposing light to the exposure unit area while leveling the wafer based upon the adjustment result.

2. An exposure method according to claim 1, wherein;
said finding the three-dimensional coordinate of the exposure unit area can be performed while exposing light to the exposure unit area and wherein the selected sensors are separated with the longest distance.

3. An exposure method according to claim 1, wherein;
a calculation-exempt area is set within the measurement target unit area; and
the measurement points are set outside the calculation-exempt area.

4. An exposure method according to claim 1, wherein;
a calculation-exempt area is set within the measurement target unit area; and
three-dimensional coordinates corresponding to the calculation-exempt area are disregarded when creating the virtual surface.

5. An exposure method according to claim 1, wherein;
said creating the virtual surface includes;
creating a temporary virtual surface by using three-dimensional coordinates of all of the measurement points;

finding a plurality of positional deviations along a predetermined coordinate axis between all of the measurement points and the temporary virtual surface;

specifying one or a plurality of measurement points manifesting an extents of positional deviation exceeding a predetermined value; and creating the virtual surface by exclusively using the three-dimensional coordinates of measurement points other than the specified measurement point.

6. An exposure method according to claim 1, wherein;

a first pre-exposure step in which a plurality of unit areas among a plurality of unit areas set in advance at a surface of a wafer are designated as measurement target unit areas;

a second pre-exposure step in which three-dimensional coordinates of a plurality of measurement points at a surface of a first measurement target unit area among said plurality of measurement target unit areas are determined;

a third pre-exposure step in which a virtual surface approximating the surface of said first measurement target unit area is ascertained by using the three-dimensional coordinates corresponding to said measurement points;

a fourth pre-exposure step in which a plurality of sensors are engaged to scan the surface of said first measurement target unit area, the extents of positional deviation of the scanning areas within said measurement target unit area scanned by said sensors relative to said virtual surface manifesting along a direction in which a specific coordinate axis extends are determined and the extents of positional deviation of the scanning areas are stored in memory as adjustment values for said sensors each corresponding to one of the scanning areas with regard to said first measurement target unit area;

a fifth pre-exposure step in which said second pre-exposure step, said third pre-exposure step and said fourth pre-exposure step are implemented on each of one or a plurality of measurement target unit areas other than said first measurement target unit area and adjustment values for said sensors with regard to said measurement target unit areas are stored in memory;

a sixth pre-exposure step in which average adjustment values are obtained by averaging said adjustment values corresponding to said plurality of measurement target unit areas including said first measurement target unit area;

a sensor selection step in which two or more sensors are selected from said plurality of sensors;

an exposure unit area setting step in which one of the plurality of unit areas is selected as an exposure unit area to undergo exposure processing; and an exposure step in which three-dimensional coordinates at a surface of said exposure unit area are measured by some of or all of said two or more sensors selected in said sensor selection step, adjustment results are obtained by utilizing said average adjustment values in processing the results of the measurement performed by said sensors and exposing light is irradiated on said exposure unit area while leveling the wafer based upon said adjustment results.

7. An exposure method comprising;

designating one of a plurality of unit areas on a surface of a wafer as a measurement target unit area;

scanning the surface of the measurement target unit area using a plurality of sensors;

finding three-dimensional coordinates of scanning areas within the measurement target unit area;

creating a virtual surface approximated to the surface of the measurement target unit area by using the three-dimensional coordinates of the scanning areas;

finding a plurality of positional deviations along a predetermined coordinate axis between the scanned measurement target unit area and the virtual surface;

storing the positional deviations as a plurality of adjustment values for the sensors;

selecting at least two sensors with the adjustment values thereof achieving smallest absolute values from the sensors;

designating one of the unit areas as an exposure unit area to be exposed;

finding a three-dimensional coordinate of the exposure unit area by at least one of the selected sensors;

finding an adjustment result from the adjustment values and the three-dimensional coordinate of the exposure unit area; and exposing light to the exposure unit area while leveling the wafer based upon the adjustment result.

8. An exposure method according to claim 7, wherein;

said finding the three-dimensional coordinate of the exposure unit area can be performed while exposing light to the exposure unit area, and wherein the selected sensors are separated with the longest distance.

9. An exposure method according to claim 7, wherein;

a calculation-exempt area is set within the measurement target unit area; and the area excluding the calculation-exempt area is scanned by the sensors.

10. An exposure method according to claim 7, wherein;

a calculation-exempt area is set within the measurement target unit area; and three-dimensional coordinates corresponding to the calculation-exempt area are disregarded when creating the virtual surface.

11. An exposure method according to claim 7, wherein;

said creating the virtual surface includes;

creating a temporary virtual surface by using three-dimensional coordinates of all of the scanning areas;

finding a plurality of positional deviations along a predetermined coordinate axis between all of the scanning areas and the temporary virtual surface;

specifying one or a plurality of scanning areas manifesting an extents of positional deviation exceeding a predetermined value; and creating the virtual surface by exclusively using the three-dimensional coordinates of scanning areas other than the specified scanning area.

12. An exposure method according to claim 7, wherein;

a first pre-exposure step in which a plurality of unit areas among a plurality of unit areas set in advance at a surface of a wafer are designated as measurement target unit areas;

a second pre-exposure step in which a surface of a first measurement target unit area among said plurality of measurement target unit areas is scanned with a plurality of sensors and three-dimensional coordinates of scanning areas within said first measurement target unit area scanned by said sensors are determined;

a third pre-exposure step in which a virtual surface approximating the surface of said first measurement target unit area is ascertained by using the three-dimensional coordinates of the scanning areas;

a fourth pre-exposure step in which the extents of positional deviation of the scanning areas in said first measurement target unit area scanned by said sensors in said second pre-exposure step relative to said virtual surface manifesting along a direction in which a specific coordinate axis extends are ascertained and the extents of positional deviation manifesting at the scanning area are stored in memory as adjustment values for said sensors each corresponding to one of the scanning areas with regard to said first measurement target unit area;

a fifth pre-exposure step in which said second pre-exposure step, said third pre-exposure step and said fourth pre-exposure step are implemented on one or a plurality of measurement target unit areas other than said first measurement target unit area and adjustment values for said sensors with regard to said measurement target unit areas are stored in memory;

a sixth pre-exposure step in which average adjustment values are obtained by averaging said adjustment values corresponding to said plurality of measurement target unit areas including said first measurement target unit area;

a sensor selection step in which at least two sensors with said adjustment values thereof achieving smallest absolute values are selected from said plurality of sensors;

an exposure unit area setting step in which one of the plurality of unit areas is selected as an exposure unit area to undergo exposure processing; and an exposure step in which three-dimensional coordinates at a surface of said exposure unit area are measured by some of or all of said two or more sensors selected in said sensor selection step, adjustment results are obtained by utilizing said average adjustment values in processing the results of the measurement performed by said sensors and exposing light is irradiated on said exposure unit area while leveling the wafer based upon said adjustment results.

13. An exposure method comprising;

designating one of a plurality of unit areas on a surface of a wafer as a measurement target unit area;

finding three-dimensional coordinates of a plurality of measurement points on a surface of the measurement target unit area;

creating a virtual surface approximated to the surface of the measurement target unit area by using the three-dimensional coordinates corresponding to the measurement points;

adjusting the positions of two or more sensors relative to the measurement target unit area so as to minimize the extents of positional deviation along a predetermined coordinate axis between the scanned measurement target unit area and the virtual surface when the measurement target unit area is scanned by the sensors;

storing the positional deviations as a plurality of adjustment values for the sensors;

designating one of the unit areas as an exposure unit area to be exposed;

finding a three-dimensional coordinate of the exposure unit area by at least of the adjusted sensors;

finding an adjustment result from the adjustment values and the three-dimensional coordinate of the exposure unit area; and exposing light to the exposure unit area while leveling the wafer based upon the adjustment result.

14. An exposure method according to claim 13, wherein;

said finding the three-dimensional coordinate of the exposure unit area can be performed while exposing light to the exposure unit area, and wherein the adjusted sensors are separated with the longest distance.

15. An exposure method according to claim 13, wherein;

a calculation-exempt area is set within the measurement target unit area; and the measurement points are set outside the calculation-exempt area.

16. An exposure method according to claim 13, wherein;

a calculation-exempt area is set within the measurement target unit area; and three-dimensional coordinates corresponding to the calculation-exempt area are disregarded when creating the virtual surface.

17. An exposure method according to claim 13, wherein;

said creating the virtual surface includes;

creating a temporary virtual surface by using three-dimensional coordinates of all of the measurement points;

finding a plurality of positional deviations along a predetermined coordinate axis between all of the measurement points and the temporary virtual surface;

specifying one or a plurality of measurement points manifesting an extents of positional deviation exceeding a predetermined value; and creating the virtual surface by exclusively using the three-dimensional coordinates of measurement points other than the specified measurement point.

* * * * *

UNITED STATES PATENT AND TRADEMARK OFFICE
CERTIFICATE OF CORRECTION

PATENT NO. : 6,704,091 B2
DATED : March 9, 2004
INVENTOR(S) : Norio Moriyama

It is certified that error appears in the above-identified patent and that said Letters Patent is hereby corrected as shown below:

<u>Title page,</u>
Item [73], Assignee, should read -- Oki Electric Industry Co., Ltd. --.

Signed and Sealed this

Twentieth Day of December, 2005

JON W. DUDAS
*Director of the United States Patent and Trademark Office*